(12) United States Patent
Baumgartner et al.

(10) Patent No.: US 8,042,075 B2
(45) Date of Patent: Oct. 18, 2011

(54) METHOD, SYSTEM AND APPLICATION FOR SEQUENTIAL COFACTOR-BASED ANALYSIS OF NETLISTS

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 12/410,962

(22) Filed: Mar. 25, 2009

(65) Prior Publication Data

US 2010/0251197 A1    Sep. 30, 2010

(51) Int. Cl.
   G06F 9/45      (2006.01)
   G06F 9/455     (2006.01)
   G06F 17/50     (2006.01)
(52) U.S. Cl. .................. 716/103; 716/108; 716/132
(58) Field of Classification Search .............. 716/103, 716/108, 132
   See application file for complete search history.

(56) References Cited

U.S. PATENT DOCUMENTS

| | | | |
|---|---|---|---|
| 6,223,141 B1 | 4/2001 | Ashar | |
| 7,689,955 B1 * | 3/2010 | van Antwerpen et al. | .... 716/113 |
| 2005/0166114 A1 | 7/2005 | Buckley | |
| 2006/0173666 A1 | 8/2006 | Jain | |
| 2006/0190869 A1 | 8/2006 | Baumgartner | |
| 2007/0220461 A1 * | 9/2007 | Baumgartner et al. | ........... 716/5 |
| 2008/0235637 A1 * | 9/2008 | Baumgartner et al. | ........... 716/4 |
| 2008/0312881 A1 * | 12/2008 | Kanazawa et al. | ................ 703/1 |
| 2009/0138837 A1 * | 5/2009 | Baumgartner et al. | ........... 716/6 |
| 2009/0234620 A1 * | 9/2009 | Kanazawa | ........................ 703/1 |
| 2009/0300559 A1 * | 12/2009 | Baumgartner et al. | ........... 716/5 |
| 2009/0300563 A1 * | 12/2009 | Moon | ............................... 716/5 |
| 2009/0300564 A1 * | 12/2009 | Kanazawa | ....................... 716/5 |
| 2010/0102825 A1 * | 4/2010 | Bushnell et al. | .............. 324/537 |
| 2010/0107132 A1 * | 4/2010 | Bjesse | ............................... 716/5 |
| 2010/0199241 A1 * | 8/2010 | Baumgartner et al. | ........... 716/5 |
| 2010/0229132 A1 * | 9/2010 | Gu et al. | ........................... 716/2 |

OTHER PUBLICATIONS

Michael L. Case et al., "Merging Nodes Under Sequential Observability" Annual ACM IEEE Design Automation Conference archive Proceedings of the 45th annual conference on Design automation table of contents Anaheim, California, Published 2008.

* cited by examiner

*Primary Examiner* — Suresh Memula
(74) *Attorney, Agent, or Firm* — Brevetto Law Group

(57) ABSTRACT

Methods, systems and computer products are provided for reducing the design size of an integrated circuit while preserving the behavior of the design with respect to verification results. A multiplexer is inserted at the gate being analyzed, and the multiplexer selector is controlled to provide a predetermined output for one frame at the point being analyzed. It is then determined whether the circuit remains equivalent during application of the predetermined output in order to decide whether the gate being analyzed is a candidate for replacement.

18 Claims, 6 Drawing Sheets

Traditional positive and negative netlist cofactoring

ODC-based netlist analysis

Netlist N given positive sequential cofactor of i1.

Netlist N given negative sequential cofactor of i1.

Original netlist N

Netlist N with behavior of g1 sequentially inverted

METHOD, SYSTEM AND APPLICATION FOR SEQUENTIAL COFACTOR-BASED ANALYSIS OF NETLISTS

BACKGROUND

1. Field of the Invention

The present invention relates to digital circuitry designs of state machines, and more specifically, to systems, methods and computer products for efficiency improvements in the digital circuitry designs.

2. Description of Related Art

An electrical circuit with memory elements may be modeled using state equations and state variables to describe the behavior and state of the system. A complete set of state variables for a system, coupled with logic that defines the transitions between states, typically contains enough information about the system's history to enable computation of the system's future behavior. Simplifying the model to reduce the number of state variables, or simplifying the logic that defines state transitions, lessens the computational cost of analyzing the model, for example, to verify that it conforms to a given specification.

The synthesis and verification of state variable models can require tremendous amounts of computational resources. A process for reducing design size would be useful in reducing computational requirements, thus enhancing logic synthesis and verification. What is needed is an automated method of reducing design size while preserving the behavior of the design with respect to verification results.

SUMMARY

Embodiments disclosed herein address the above stated needs by providing a framework by which to assess the impact of specific gate upon the behavior of a sequential design. This framework includes methods of sequential cofactoring, that is, the injection of circuitry which toggles the valuation of a gate at a particular time-step. This framework generalizes combinational toggle analysis which is used for applications such as assessing observability don't care conditions, i.e., conditions under which a gate may be eliminated to enhance synthesis or verification. This generalization enables an efficient framework to perform sequential-analysis based reductions which are more powerful than combinational analysis. In addition, several distinct applications are disclosed which benefit from this particular modeling vs. methods of sequential generalization which cofactor across all time-frames. Said method is implemented through the addition and manipulation of circuitry to a design, hence is applicable for analysis using logic evaluation frameworks such as logic simulators or formal verification algorithms, as well as hardware-based frameworks such as logic emulators/accelerators and even fabricated chips.

Various embodiments disclosed herein provide systems, computer products and methods for sequential cofactor-based circuit design for a sequential circuitry netlist. An arbitrary gate of the sequential circuitry is selected for analysis, and then the sequential circuitry netlist is configured to connect the arbitrary gate to a multiplexer. The sequential circuitry netlist is also configured to connect selector control circuitry to a selector input of the arbitrary gate. In response to detecting a ctime signal applied to the selector input, the multiplexer output is set to alter the arbitrary gate output, and a determination is made as to whether the sequential circuitry behavior remains equivalent during time that the multiplexer output is set to alter the arbitrary gate output.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

One technique for performing reduction on a circuitry design is the observability don't care based analysis. This type of analysis identifies conditions under which the value of a gate does not impact the overall behavior of the circuit, thus yielding flexibilities under which the design may be simplified. Such techniques operate by inverting the value of a specific gate and enumerating conditions under which the original gate and the modified gate evaluate the same. Alternate verification paradigms rely upon cofactoring, that is, replacing a gate of the design by constant 0 vs. 1 to reduce verification complexity or to enumerate the impact of that gate upon the remainder of the circuit. Both of these styles of analysis have traditionally been limited to operating on combinational circuits. This disclosure adapts combinational cofactoring for verification and synthesis through sequential cofactoring for use in digital circuitry designs of state machines and additionally enumerates several applications to exploit the benefit of these novel techniques. Furthermore, this sequential cofactoring solution may be achieved purely in terms of logic circuitry, allowing it to be used in a variety of circuit-based analysis frameworks such as logic simulators, FPGAs and hardware accelerators, formal reasoning algorithms, and even semiconductor devices.

Figure 1A:
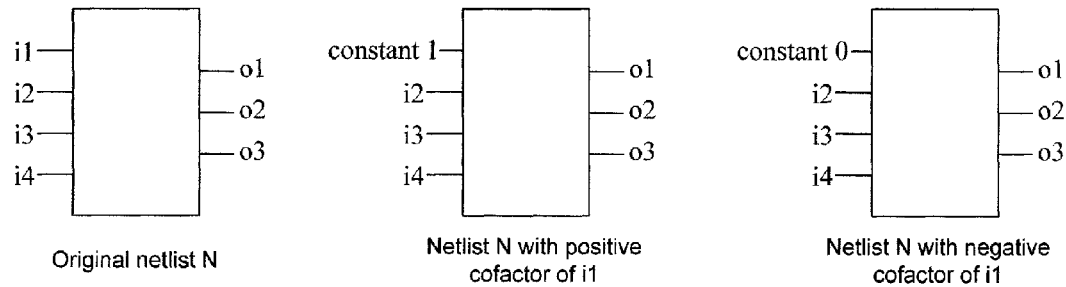
FIG. 1A depicts inputs and outputs for positive and negative cofactoring.

FIG. 1A depicts inputs and outputs for positive and negative cofactoring. This example illustrates an arbitrary design with four inputs i1 . . . i4 and four outputs o1 . . . o4. Generally, the design being analyzed may have an arbitrary number of inputs and outputs (the same may be said of the designs of FIG. 1B, FIG. 2A-2B, and FIG. 4A-4B). Cofactor-based analysis has a variety of traditional applications in verification. For example, given a combinational netlist, cofactor-based analysis may be used as a case splitting procedure by first analyzing the behavior of the netlist if an arbitrary gate is positively cofactored, then negatively cofactored. An example of the type of analysis which may be performed upon the cofactored circuit is satisfiability checking where one may wish to assess whether a particular gate in the netlist may evaluate to a given value, e.g., 1. The cofactoring simplifies the netlist representation, such that the analysis performed on the cofactored netlist may be substantially lesser in computational resources since satisfiability checking generally requires exponential runtime with respect to netlist size. FIG. 1A depicts inputs and outputs involved in netlist cofactoring. The figure shows an original netlist N with four inputs i1 . . . i4, then with input i1 being positively and negatively cofactored.

Figure 1B:
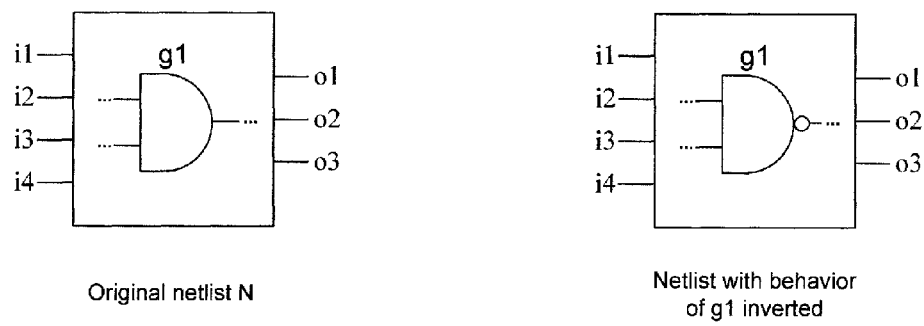
FIG. 1B depicts inputs and outputs for ODC-based netlist analysis.

FIG. 1B depicts inputs and outputs for observability don't care (ODC) based netlist analysis, another traditional application similar to cofactor-style analysis. ODCs refer to conditions under which the value of a particular gate does not affect the behavior of the overall netlist, due to being masked by other values of other gates. For example, given a small netlist consisting of an AND gate with inputs gate1 and gate2, an ODC condition for gate1 is that gate2 evaluates to 0. Under this situation, the AND gate will evaluate to 0 regardless of the value of gate1. ODCs may be used to optimize circuits for enhanced synthesis or verification, e.g., if the circuit has a gates which is equal to gate1 except in states where gate2=0, gate1 and gate3 may be merged to reduce netlist size without altering the overall netlist behavior. Performing ODC analysis often entails analyzing two copies of a netlist, one being the original netlist and the other being a netlist where the gate whose ODC conditions are being assessed has an inverter injected at its output as depicted in FIG. 1B. The arbitrary gate conditions under which the outputs of the netlist are equal represent the ODC space with respect to the gate under analysis. FIG. 1B shows the ODC formulation for netlist N with respect to gate g1.

Figure 2A:
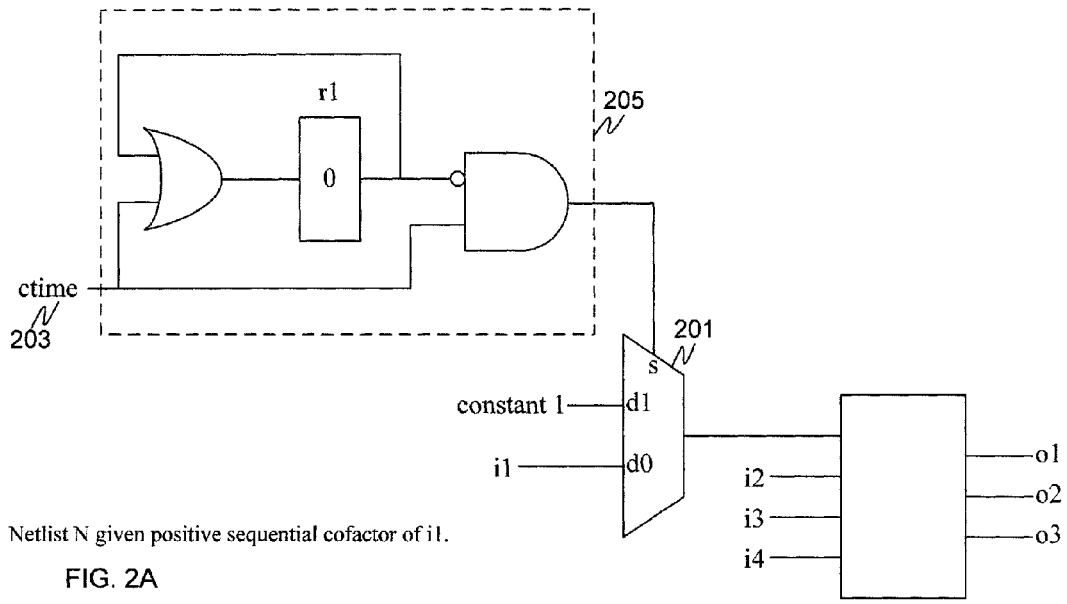
FIGS. 2A-B depicts circuitry for sequential positive and negative cofactoring.
Figure 2B:
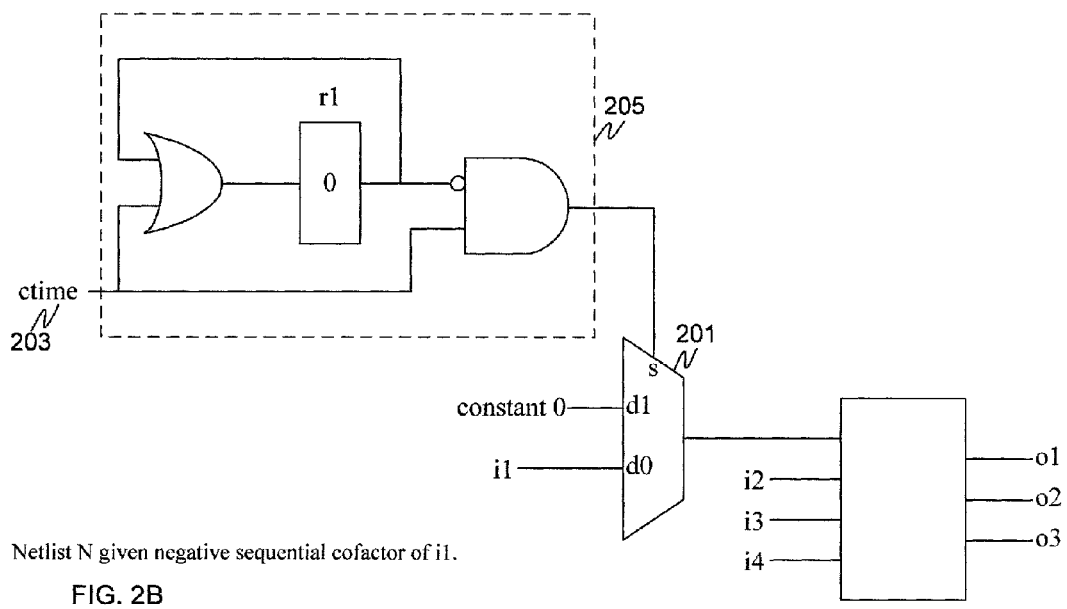

FIGS. 2A-B depicts circuitry for sequential positive and negative cofactoring for arbitrary gate i1, one facet of the current disclosure. Sequential cofactoring generalizes upon the combinational cofactor. However, instead of merely replacing an arbitrary gate i1 by a constant, the sequential cofactor replaces that arbitrary gate by a multiplexor 201 and circuitry 205 designed to control the multiplexor for one time frame. The dotted lines in FIGS. 2A-B merely indicate one implementation for circuitry 205 designed to evaluate to 1 for only one time-frame upon detecting a first incidence of ctime=1. It should be noted that the circuitry depicted in FIGS. 2A-B (and FIGS. 4A-B) may be located within the circuitry design located entirely on a single chip, or equivalently located along with whatever representation of the circuitry being analyzed happens to be applicable to the desired application—e.g., within a field programmable gate array (FPGA) or other reconfigurable hardware module used for hardware acceleration. In some implementations some of the inputs i1-i4 and outputs o1-o4 may not necessarily be chip inputs or outputs. These inputs and outputs may simply connect to other Circuitry in the netlist. In other implementations one or more of the inputs and outputs may, in some instances, be chip inputs/outputs. Further, in some implementations the number of netlist inputs or outputs may be considerably greater.

In the embodiments depicted in FIGS. 2A-B the selector s of the multiplexor is selected by a gate (the circuitry 205) which may evaluate to 1 for only one arbitrary time-frame. When the selector s evaluates to 1, a constant is driven at the output of the multiplexor. The constant equals 1 in FIG. 3A and 0 in FIG. 3B. At other timeframes aside from the first assertion of ctime=1, the arbitrary gate is driven at the output of the multiplexor 201. The input variable "ctime" in at least one embodiment is a new arbitrary gate introduced to control the time-frame when the cofactor value will be driven onto i1 during its first assertion to value 1. In alternative embodiments, "ctime" may be connected to arbitrary circuitry—e.g., to allow the application embedding the circuitry of 205 to control this first assertion time, possibly in response to other activity in the circuit or under control of a human interacting with said application. Examples of circuit activity which may trigger the ctime assertion include the detection of a specific type of instruction at a specific interface within a circuit, the detection of a data buffer filling or emptying, the detection of a specific request or grant condition at an arbitration unit of the circuit or an indication that a specific number of circuit "clocks" or time have elapsed during the analysis. The cofactoring is accomplished through multiplexor 201 which drives the cofactor constant when its selector s evaluates to 1, otherwise it drives i1. The selector is driven by logic which evaluates to 1 exactly upon the first assertion of "ctime." Past assertions are accounted for by register r1 which initializes to 0, then remains 1 after the first assertion of the "ctime."

Figure 3:
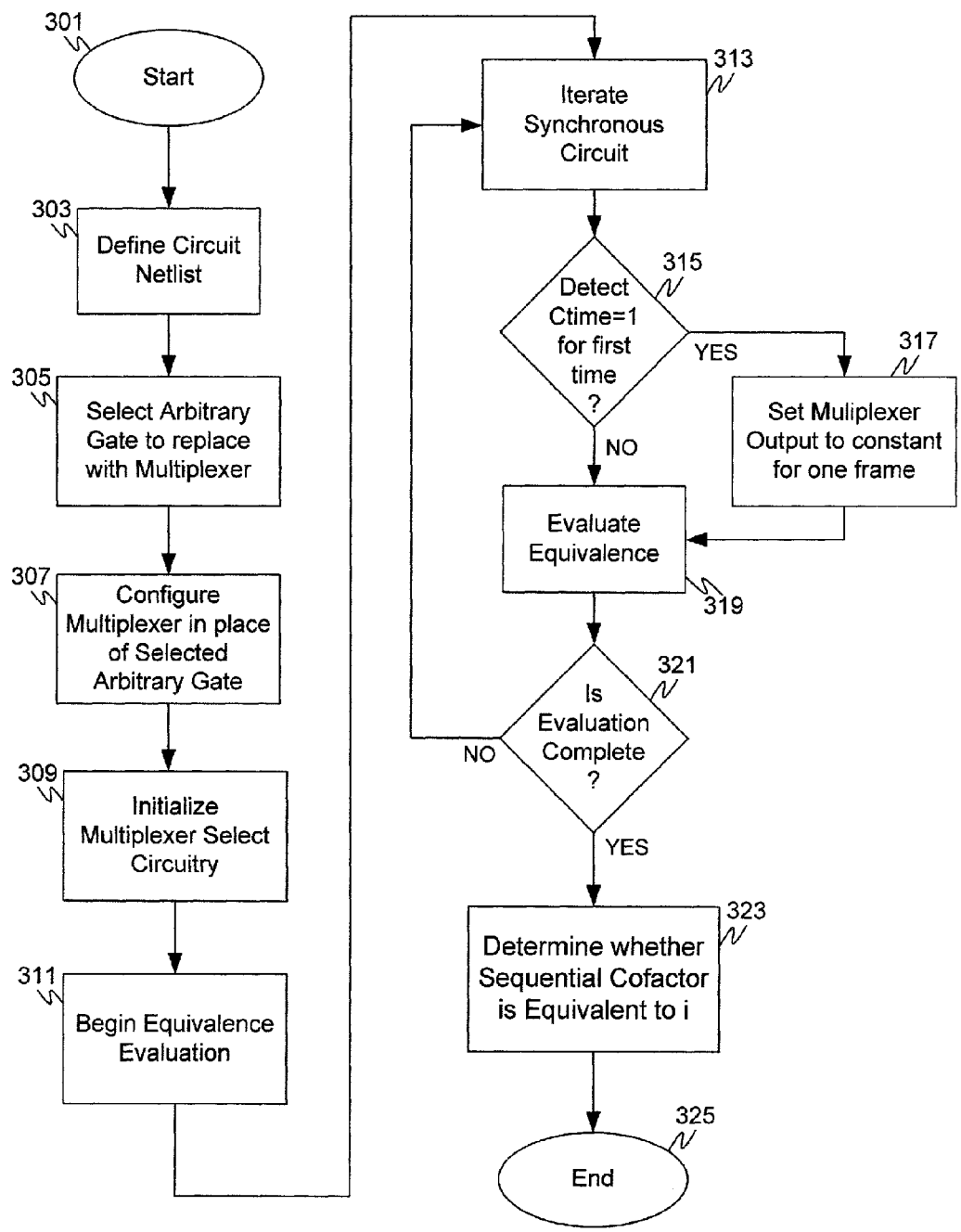
FIG. 3 is a flowchart depicting a method of sequential positive and negative cofactoring according to various embodiments of the invention.

FIG. 3 is a flowchart 300 depicting a method of sequential positive and negative cofactoring according to various embodiments of the invention. The method begins at 301 and proceeds to 303 to define the circuit netlist specifying the initial circuit design. This includes defining the conventions and terms, setting the initial conditions of the system model, and may entail importing data to prepare the netlist for the design to be manipulated through sequential cofactoring. An exemplary netlist contains a directed graph with vertices representing gates, and edges representing interconnections between those gates. The gates have associated functions, such as constants, primary inputs (which may be referred to as arbitrary gates or sometimes as RANDOM gates), combinational logic such as AND gates, and sequential state holding elements. A sequential state holding element has one or more inputs and at least one output, each of which may be characterized by discrete states (e.g., logical 1 or logical 0). The various embodiments can be practiced with any sort of state machine including state holding elements (e.g., registers, latches, RAM circuitry, or the like), sometimes called memory elements. The state of the output (or the state of each output, if more than one) is determined by the previous states of the input channels. The initialization time or reset time of a register is referred to herein as time zero (t=0). Registers typically have two associated components, their next-state functions and their initial-value functions. Both of these associated components may be represented as other gates in the graph. Semantically, for a given register the value appearing at its initial-value gate at time logical 0 will be applied as the value of the register itself (time "0"="Initialization" or "reset" time). The value appearing at its next-state function gate at time "i" will be applied to the register itself at time "i+1". Certain gates of the model may be labeled as targets. Targets correlate to the properties sought to be verified. One goal of the verification process is to find a way to drive a "1" to a target node, and generate a "trace" illustrating (or reporting) this scenario if one is found. Another goal of verification is to prove that no such assertion of the target is possible, that is, there is no way to drive a "1" to the target node.

Upon completing 303 to define the circuit netlist the method proceeds to 305 to select an arbitrary gate to replace with a multiplexer. By arbitrary gate it is simply meant that a gate (or set of gates) is chosen for analysis. For example, in FIGS. 2A-B the input i1 is chosen as the gate to be analyzed by replacing i1 with multiplexer 201 under control of circuitry 205. In 307 the multiplexer inputs and output are configured. One multiplexer input is tied to an input i associated with the selected arbitrary gate. The other multiplexer input is tied to a constant, either 1 as in FIG. 2A or else 1 as in FIG. 2B. As depicted in FIGS. 2A-B the output of multiplexer 201 is tied to the point in the circuitry formerly connected to input i1. The method then proceeds to 309 to set the circuitry to initial conditions.

In block 311 the evaluation for equivalence begins for the arbitrary gate being analyzed. This may simply entail recording the inputs and outputs for later analysis, or may be done after each clock period, depending upon the complexity of the circuitry being analyzed and the particularities of the implementation. Alternatively, this may entail creating a secondary copy of the netlist, manipulating it as per the flowchart of FIG. 3 yet driving an alternate constant value at said multiplexor circuitry so that the behavior of the two copies may be directly compared for equivalence or inequivalence (refer to the two netlists of FIGS. 2A and 2B, respectively). As yet another alternative, it is possible that no direct equivalence comparison is needed Instead, this sequential cofactor circuitry may be used to manipulate a design under analysis to see if it may trigger some behavioral modification (e.g., the failure of "self-check" circuitry or any other form of behavioral correctness checking specification), and the evaluation of equivalence refer solely to the modified design exhibiting expected behavior. The method proceeds to 313 to begin operation of the synchronous circuit. Values for the inputs (e.g., i1 through i4 of FIGS. 2A-B; Note again that the particular number of inputs of the design will generally vary, and FIGS. 2A-B merely represent one particular design) are applied to the circuitry in their proper sequence. Upon completing 313 the method proceeds to 315 to determine whether 1 has been applied to the ctime input for the first time.

Applying ctime=1 the first time causes circuitry 205 to control the multiplexer 201 selector to select the constant output—either a constant 1 as per FIG. 2A or a constant 0 as per FIG. 2B. After the first time a 1 input has been applied to ctime the circuitry 205 no longer will apply the constant voltage (1 or 0). Instead the multiplexer 201 selector is controlled to provide arbitrary gate input i1 at the output of the multiplexer 201 at all times after the initial application of ctime=1 has been processed. In other words the multiplexer control circuitry 205 "remembers" that ctime=1 has already taken place, and therefore controls multiplexer 201 to apply input i1 at the multiplexer 201 output. Upon detecting the initial application of ctime=1 the method proceeds from 315 along the YES path to 317 to set the multiplexer 201 output to a constant value for one time frame. The method then proceeds to 319 to evaluate the equivalence of the circuit and then on to 321 to determine whether the analysis is complete. Back in 315, if it is determined that the ctime input is not 1 for the first time the method proceeds from 315 along the NO path to 319 to evaluate the equivalence of the circuit. Upon completing 319 the method proceeds to 321.

In block 321 if it is determined that the evaluation is not yet complete the method proceeds from 321 along the NO path back to 313 to iterate the synchronous circuit, thus causing another set of inputs (e.g., i1-i4 from FIGS. 2A-2B) to be applied to the circuitry. However, if it is determined in 321 that the analysis is complete the method proceeds from 321 along the YES path to 323 to determine whether the sequential cofactor is equivalent to the i1 input at the particular time undergoing analysis—that is, the results flowing from the application of ctime=1 applied to the input in place of i1. Upon completing block 323 the method proceeds to 325 and ends.

Figure 4A:
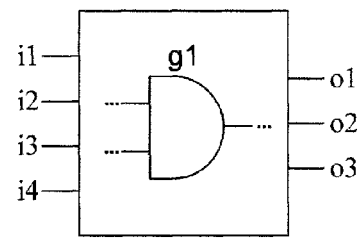
FIGS. 4A-B depicts circuitry for sequential ODC netlist analysis.
Figure 4B:
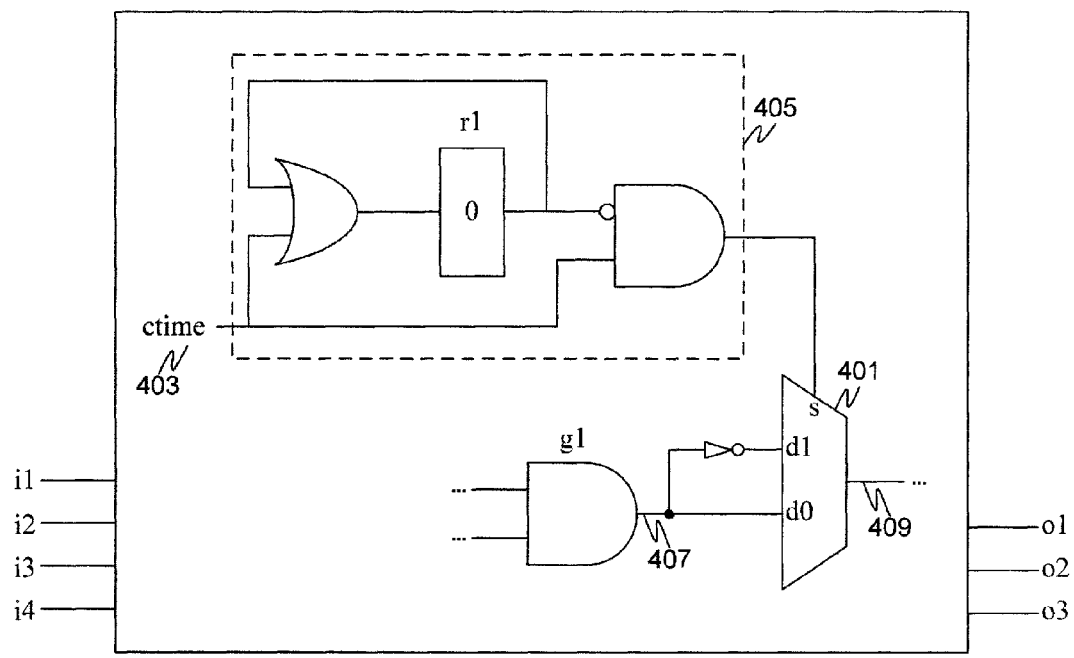

FIGS. 4A-B depicts circuitry for sequential observability don't care (ODC) netlist analysis. Note that this circuitry is with respect to a single arbitrary design with four inputs i1-i4 and four outputs o1-o4. Generally, the design being analyzed may have an arbitrary number of inputs and outputs. ODC analysis, as disclosed herein, is a sequential generalization of the inversion-based ODC-analysis procedure. Similarly to the sequential cofactor, logic is introduced to create a signal that evaluates to 1 for one specific time-frame, particularly, the first time-frame when the newly introduced input ctime evaluates to 1. This signal is also used to select a multiplexor m1. If the selector is 0, the original behavior of gate g1 is driven through the multiplexor. In response to 1 being applied to the selector the inverted behavior of gate g1 is driven through the multiplexor.

Figure 5:
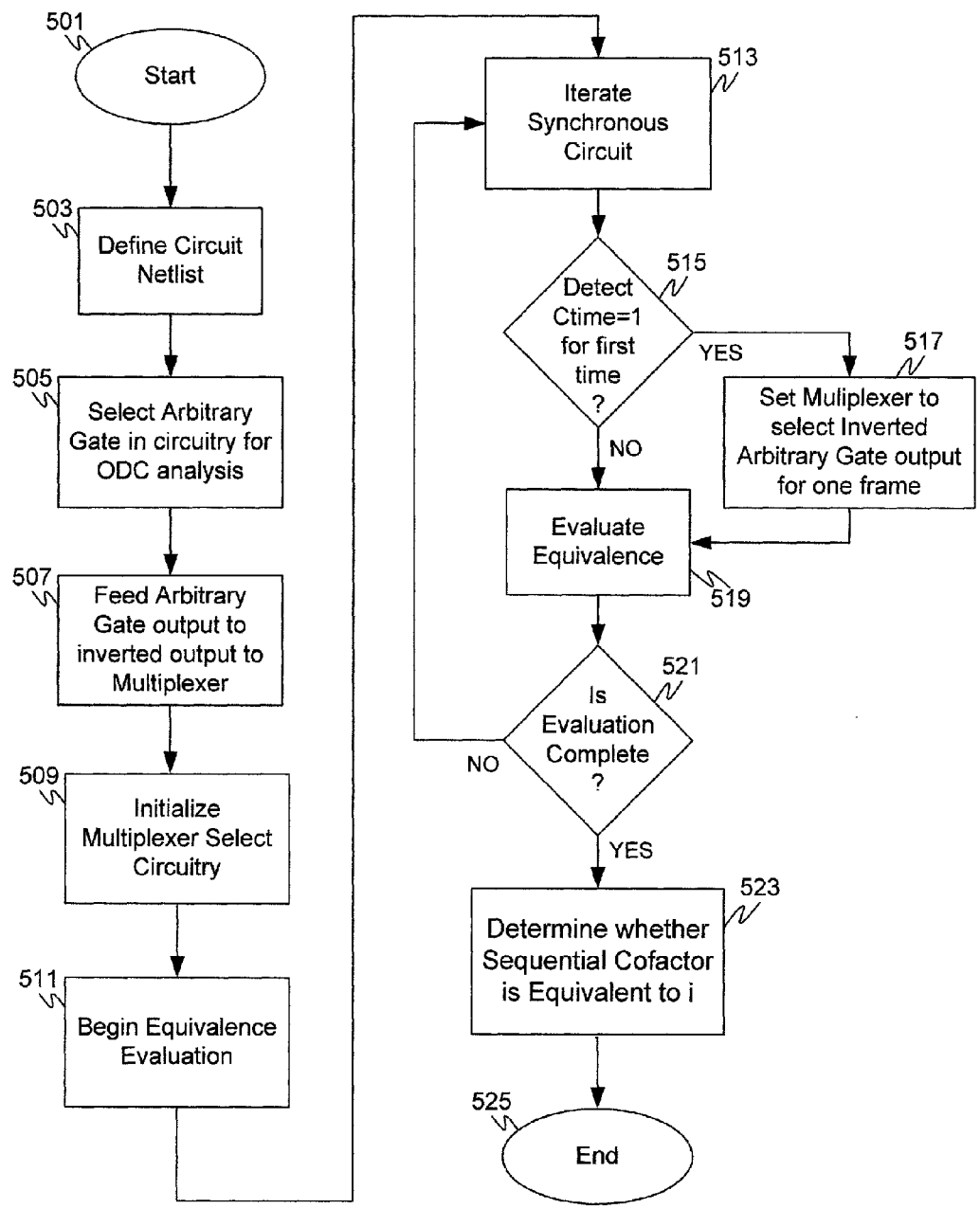
FIG. 5 is a flowchart depicting a method of sequential inversion based ODC netlist analysis according to various embodiments of the invention.

FIG. 5 is a flowchart 500 depicting a method of sequential inversion based ODC netlist analysis according to various embodiments of the invention. The method begins at 501 and proceeds to 503 to define the circuit netlist specifying the initial circuit design. As discussed above in conjunction with FIG. 3 defining the netlist includes defining the conventions and terms, setting the initial conditions of the system model, and may entail importing data to prepare the netlist for the design to be manipulated through sequential ODC introduction. Once the circuit netlist is defined in 503 the method proceeds to 505 to select an arbitrary gate to replace with a multiplexer. In this embodiment the selected gate may not necessarily be a gate directly connected to an input or an output of the circuitry being analyzed. But rather, the selected gate may be any gate within the circuitry. Once the gate is selected in 505 the method proceeds to 507. In 507 an output of the selected gate is tied to the multiplexer, as can be seen in FIGS. 4A-B. The output 407 of gate g1 is fed to an input of multiplexer 401. An inverted output 407 of gate g1 is also fed to a multiplexer 401 input. As discussed above for the similar circuitry of FIGS. 2A-B, the circuitry 405 is designed to evaluate to 1 for only one time-frame upon detecting a first incidence of ctime=1 being applied. Returning to block 507, once the gate is tied to the multiplexer the method proceeds to 509 to set the multiplexer select circuitry to initial conditions. The method then proceeds to 511.

In block 511 the evaluation for equivalence begins for the gate being analyzed. Similar to the discussion of block 311 from FIG. 3, in some implementations the equivalence analysis may take place after data is gathered, or through directly comparing an original netlist to the behavior of the modified netlist as per blocks 505-509, or be performed more implicitly through merely assessing behavior with respect to an available design specification. For certain arrangements block 511 may entail beginning to record the synchronous circuit inputs and outputs for later analysis. In other implementations the equivalence analysis may take place on the fly as the data is being shifted through the synchronous circuit. The method proceeds to 513 to iterate the synchronous circuitry, beginning its operation for evaluation. Values for the inputs (e.g., i1 through i4 of FIGS. 4A-B) are applied to the circuitry in their proper sequence, and the values of the outputs o1 through o3, and the output (409 in FIG. 4B) of the multiplexer, are observed for evaluation. The method then proceeds to 515 to determine whether or not 1 has been applied to the ctime input for the first time. At all circuitry iterations before ctime=1 for the first time the multiplexer (401 in FIG. 4B) is controlled so that the d0 input is selected for the multiplexer output. Applying ctime=1 the first time causes circuitry 405 to control the multiplexer (401 of FIG. 4B) selector to select the inverted gate output d1. After the first time a 1 input has been applied to ctime the circuitry (405 of FIG. 4B) no longer will apply the inverted gate output, that is, the d1 input of multiplexer (401 in FIG. 4B). Instead the multiplexer 401 selector is controlled to pass the gate output (multiplexer d0 input) at the output of the multiplexer (401 in FIG. 4B) at all times after the initial application of ctime=1 has been processed.

Returning to FIG. 5, in block 515 if the initial application of ctime=1 is detected the method proceeds from 515 along the YES path to 517 to set the multiplexer 401 output to the inverted arbitrary gate output provided to multiplexer input d1. The method then proceeds to 519 to evaluate the equivalence of the circuit, and then on to 521 to determine whether the analysis is complete. Returning to block 515, if it is determined that the ctime input is not 1 for the first time the method proceeds from 515 along the NO path to 519 to evaluate the equivalence of the circuit, and then on to 521.

In block 521 if it is determined that the evaluation is not yet complete the method proceeds from 521 along the NO path back to 513 to iterate the synchronous circuit again, thus causing another set of inputs i1-i4 to be applied to the circuitry of FIG. 4B. However, if it is determined in 521 that the analysis is complete the method proceeds from 521 along the YES path to 523 to determine the result of the sequential ODC analysis, namely, to determine whether the circuitry is equivalent with an inverted output of arbitrary gate g1 being provided via the multiplexer 401. Upon completing block 523 the method proceeds to 525 and ends.

There are a number of benefits and applications for the sequential cofactoring constructs, namely the sequential positive and negative cofactoring described in conjunction with FIG. 3 and the method of sequential inversion based ODC netlist analysis described in conjunction with FIG. 5. We first note that when analyzing sequential netlists, combinational-style cofactoring of replacing an arbitrary gate by a constant may not preserve the verification task of checking whether a target gate can ever evaluate to 1. For example, a particular target may assert only if a given arbitrary gate toggles from 0 to 1. If we tie that arbitrary gate to 0 and check whether the target can be asserted, it cannot. If we tie that arbitrary gate to 1 and check whether the target can be asserted, it cannot. However, without the cofactoring, the target can indeed assert. Thus, while cofactoring as a case splitting strategy works properly for combinational netlists, it does not work properly for sequential netlists. Various embodiments of the current invention overcome this drawback. A similar drawback is observed for ODC type analysis, and is overcome by the sequential inversion-based ODC aspect of this invention.

It should be noted that there are several applications to demonstrate the utility of sequential cofactoring, since unlike combinational cofactoring it is no longer necessarily the case that the cofactors result in simpler sub-problems. For ODC-style analysis, the benefits of the sequential cofactoring analysis are clear. They enable the identification of don't care conditions over time for the overall circuit, whereas use of the combinational ODC construct on combinational portions of the overall sequential netlist (e.g., between registers and their next-state functions) is suboptimal since it does not take into consideration don't cares which propagate through the registers.

Another application where the sequential cofactor is useful is for identifying the subset of the netlist which is sensitized by the behavior of a specific gate, possibly under specific time-frames. For example, to develop a case-splitting strategy for enhanced verification it is useful to identify a subset of logic that may be used to process a specific opcode. Alternatively, one may wish to analyze a small "cut" (subset) of logic which is impacted by a specific gate. The "cut" refers to the number of nets which fan out from logic which may be impacted, to logic which has not yet been identified as being impacted. This cut may be used to direct algorithms which simplify the netlist representation in the fanin of the cut for enhanced synthesis or verification. The assessment of logic which may be sensitized by the behavior of the gate may be performed by analyzing the behavior of both cofactors with respect to a sequence of input stimuli, and enumerating those gates which differ in behavior across the cofactors.

Figure 6:
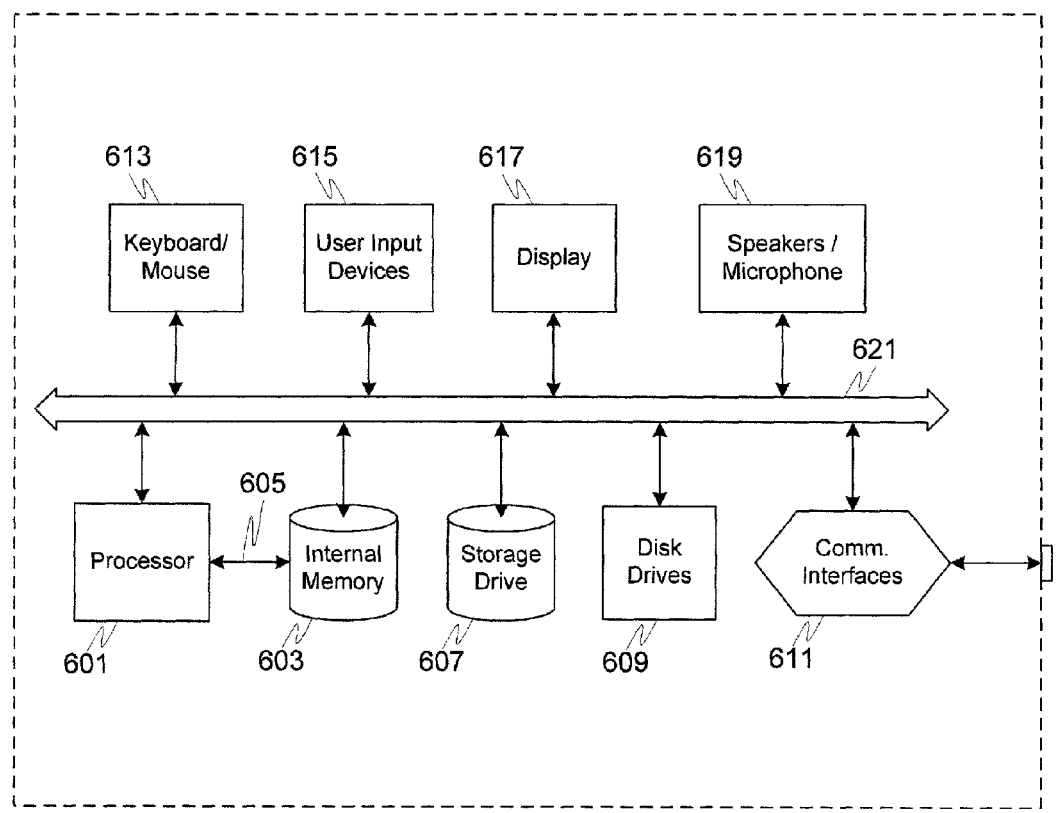
FIG. 6 depicts a computer system 600 suitable for implementing and practicing various exemplary embodiments.

The benefit of our sequential cofactor for such enumeration is twofold: first, one may use an inductive style analysis where each register within both copies of the netlist (for both cofactors) are randomized, but to the same value, then ctime is tied to 1 forcing the cofactor value to be sensitized at time 0 of the inductive instance. This simplifies the logic in the cofactoring further. Second, one may wish to specifically manipulate the analysis of the sequentially cofactored netlist during the time-frame of the cofactoring. For example, one may wish to use the ctime variable to case-split upon when performing symbolic simulation. This may reduce the complexity of analyzing the sequential cofactoring substantially, particularly when using bounded formal analysis such as symbolic simulation or bounded model checking FIG. 6 depicts an exemplary computer system 600 suitable for implementing and practicing various exemplary embodiments. The computer system 600 may be configured in the form of a desktop computer, a laptop computer, a mainframe computer, or any other arrangements capable of being programmed or configured to carry out instructions. The computer system 600 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 600 includes a processor 601 which may be embodied as a microprocessor or central processing unit (CPU). The processor 601 is typically configured to access an internal memory 603 via a bus such as the system bus 621. The internal memory 603 may include one or more of random access memory (RAM), read-only memory (ROM), cache memory, or a combination of these or other like types of circuitry configured to store information in a retrievable format. In some implementations the internal memory 603 may be configured as part of the processor 601, or alternatively, may be configured separate from it but within the same packaging. The processor 611 may be able to access internal memory 603 via a different bus or control lines (e.g., local bus 605) than is used to access the other components of computer system 600.

The computer system 600 also typically includes, or has access to, one or more storage drives 607 (or other types of storage memory) and floppy disk drives 609. Storage drives 607 and the floppy disks for floppy disk drives 609 are examples of machine readable mediums suitable for storing the final or interim results of the various embodiments. The storage drive 607 is often a hard disk drive configured for the storage and retrieval of data, computer programs or other information. The storage drive 607 need not necessary be contained within the computer system 600. For example, in some embodiments the storage drive 607 may be server storage space within a network or the Internet that is accessible to the computer system 600 for the storage and retrieval of data, computer programs or other information. For example, the computer system 600 may use storage space at a server storage farm accessible by the Internet 650 or other communications lines. The floppy disk drives 609 may include a combination of several disc drives of various formats that can read and/or write to removable storage media (e.g., CD-R, CD-RW, DVD, DVD-R, floppy disk, etc.). The computer system 600 may either include the storage drives 607 and floppy disk drives 609 as part of its architecture (e.g., within the same cabinet or enclosure and/or using the same power supply), as connected peripherals, or may access the storage drives 607 and floppy disk drives 6.09 over a network, or a combination of these. The storage drive 607 is often used to store the software, instructions and programs executed by the computer system 600, including for example, all or parts of the computer application program for project management task prioritization.

The computer system 600 may include communication interfaces 611 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 600 may be connected to the Internet via the wireless router 601 (or a wired router or other node—not show) rather than have a direct connected to the Internet. The components of computer system 600 may be interconnected by a bus 621 and/or may include expansion slots conforming to any of various industry standards such as PCI (Peripheral Component Interconnect), ISA (Industry Standard Architecture), or EISA (enhanced ISA).

Typically, the computer system 600 includes one or more user input/output devices such as a keyboard and/or mouse 613, or other means of controlling the cursor (e.g., touch-screen, touchpad, joystick, trackball, etc.) represented by the user input devices 615. The communication interfaces 611, keyboard and mouse 613 and user input devices 615 may be used in various combinations, or separately, as means for receiving information and other inputs to be used in carrying out various programs and calculations. A display 617 is also generally included as part of the computer system 600. The display may be any of several types of displays, including a liquid crystal display (LCD), a cathode ray tube (CRT) monitor, a thin film transistor (TFT) array, or other type of display suitable for displaying information for the user. The display 617 may include one or more light emitting diode (LED) indicator lights, or other such display devices. In addition, most computer systems 600 also include, or are connected to, one or more speakers and microphones 619 for audio output and input. Speech recognition software may be used in conjunction with the microphones 619 to receive and interpret user speech commands.

The invention may be implemented with any sort of processing units, processors and controllers capable of performing the stated functions and activities. For example, the processor 601 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 603, the storage drive 607, or other type of machine-readable medium, including for example, floppy disks, optical disks, a hard disk, CD, flash memory, ram, or other type of machine readable medium as recognized by those of ordinary skill in the art.

State holding elements, or state elements, are discussed above in terms of being implemented as registers or gates. However, in some embodiments any sort of state holding element or memory element may be used to implement various embodiments, including for example, registers, latches, state machines, or the like. For the purposes of illustrating and explaining the invention the terms variable, gate and register have been used interchangeably throughout this disclosure.

Various activities may be included or excluded as described above, or performed in a different order, while still remaining within the scope of at least one exemplary embodiment. For example, block 509 may be omitted so that the circuitry begins at some random state, or at a state other than an initial condition state. Other steps or activities of the methods disclosed herein may be omitted or performed in a different manner while remaining within the intended scope of the invention. The method may be implemented through the addition and manipulation of circuitry to a design, hence is applicable for analysis using logic evaluation frameworks such as logic simulators or formal verification algorithms, as well as hardware-based frameworks such as hardware emulators/accelerators and even fabricated chips. Detection that design behavior is unaffected by the introduction of said multiplexer and associated logic may be used to indicate the opportunity to simplify said design for enhanced synthesis or verification, or to denote other desirable characteristics of said design, e.g. fault tolerance.

The invention may be implemented with any sort of processing units, processors and controllers (e.g., processor 601 of FIG. 6) capable of performing the stated functions and activities. For example, the processor 601 may be embodied as a microprocessor, microcontroller, DSP, RISC processor, or any other type of processor that one of ordinary skill would recognize as being capable of performing the functions described herein. A processing unit in accordance with at least one exemplary embodiment can operate computer software programs stored (embodied) on computer-readable medium such as the disk drives 609, the storage drive 607 or any other type of hard disk drive, CD, flash memory, ram, or other computer readable medium as recognized by those of ordinary skill in the art. The computer software programs can aid or perform the steps and activities described above. For example computer programs in accordance with at least one exemplary embodiment may include: source code for selecting an arbitrary gate of the sequential circuitry for analysis, source code for configuring the sequential circuitry netlist to connect the arbitrary gate to a multiplexer, source code for configuring the sequential circuitry netlist to connect selector control circuitry to a selector input of the arbitrary gate, source code for detecting an incoming call, source code for detecting a ctime signal applied to said selector input source code for in response to the ctime signal, setting, by the execution of said instructions, the multiplexer output to alter the arbitrary gate output, and source code for determining, by the execution of said instructions, whether the sequential circuitry behavior remains equivalent during time that the multiplexer output is set to alter the arbitrary gate output. There are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of sequential cofactor-based circuit design for a sequential circuitry netlist, the method comprising:
    selecting an arbitrary gate of the sequential circuitry netlist for analysis;
    configuring the sequential circuitry netlist to connect the arbitrary gate to a multiplexer;
    configuring the sequential circuitry netlist to connect selector control circuitry to a selector input of the arbitrary gate;
    detecting a ctime signal applied to said selector input;
    in response to the ctime signal, setting the multiplexer output to alter an output of the arbitrary gate; and
    determining whether the sequential circuitry behavior remains equivalent during time that the multiplexer output is set to alter the arbitrary gate output.

2. The method of claim 1, further comprising:
    indicating the arbitrary gate as a candidate for replacement upon determining whether the sequential circuitry behavior remains equivalent despite the multiplexer output being set to alter the arbitrary gate output.

3. The method of claim 1, wherein the configuring of the sequential circuitry netlist to connect the arbitrary gate to a multiplexer further comprises:
    connecting the arbitrary gate output to a first input of the multiplexer;
    connecting a constant value to a second input of the multiplexer; and
    connecting an output of the multiplexer at a point in the sequential circuitry where the arbitrary gate output was previously connected.

4. The method of claim 1, wherein said ctime signal is applied in response to detecting a human input for controlling the ctime signal.

5. The method of claim 1, wherein said ctime signal is applied in response to detecting a specific behavior or activity within said circuitry for controlling the ctime signal.

6. The method of claim 5, wherein said specific behavior or activity is selected from a group consisting of detecting a specific type of instruction at a predetermined interface within said circuitry, detecting a first data buffer filling to a predetermined level, detecting a second data buffer emptying to a predetermined level, detecting a specific request or grant condition at an arbitration unit of the sequential circuitry netlist, and detecting an indication that a predetermined amount of time has elapsed during analysis of the sequential circuitry netlist.

7. The method of claim 1, wherein the configuring of the sequential circuitry netlist to connect the arbitrary gate to a multiplexer further comprises:
    connecting the arbitrary gate output to a first input of the multiplexer;
    connecting an inversion of the arbitrary gate output to a second input of the multiplexer; and
    connecting an output of the multiplexer at a point in the sequential circuitry where the arbitrary gate output was previously connected.

8. The method of claim 2, wherein the arbitrary gate is a first random gate, said method further comprising:
    selecting a second arbitrary gate of the sequential circuitry for analysis; and
    indicating the second arbitrary gate as a candidate for replacement upon determining whether the sequential circuitry behavior remains equivalent despite the multiplexer output being set to alter the second arbitrary gate output.

9. The method of claim 1, wherein said time that the multiplexer output is set to alter the arbitrary gate output is a single clock period.

10. A software product comprising a program of instructions stored on a non-transitory machine readable device for sequential cofactor-based circuit design of a sequential circuitry netlist wherein the program of instructions upon being executed on a computer causes the computer to perform activities comprising:
    selecting an arbitrary gate of the sequential circuitry netlist for analysis;
    configuring the sequential circuitry netlist to connect the arbitrary gate to a multiplexer;
    configuring the sequential circuitry netlist to connect selector control circuitry to a selector input of the arbitrary gate;
    detecting a ctime signal applied to said selector input;
    in response to the ctime signal, setting the multiplexer output to alter an output of the arbitrary gate; and
    determining whether the sequential circuitry behavior remains equivalent during time that the multiplexer output is set to alter the arbitrary gate output.

11. The product of claim 10, wherein said computer further causes the computer to perform activities comprising:
    indicating the arbitrary gate as a candidate for replacement upon determining whether the sequential circuitry behavior remains equivalent despite the multiplexer output being set to alter the arbitrary gate output.

12. The product of claim 10, wherein the configuring of the sequential circuitry netlist to connect the arbitrary gate to a multiplexer further comprises:
    connecting the arbitrary gate output to a first input of the multiplexer;
    connecting a constant value to a second input of the multiplexer; and
    connecting an output of the multiplexer at a point in the sequential circuitry where the arbitrary gate output was previously connected.

13. The product of claim 10, wherein said ctime signal is applied in response to detecting a human input for controlling the ctime signal.

14. The product of claim 10, wherein said ctime signal is applied in response to detecting a specific behavior or activity within said circuitry for controlling the ctime signal.

15. The product of claim 14, wherein said specific behavior or activity is selected from a group consisting of detecting a specific type of instruction at a predetermined interface within said circuitry, detecting a first data buffer filling to a predetermined level, detecting a second data buffer emptying to a predetermined level, detecting a specific request or grant condition at an arbitration unit of the sequential circuitry netlist, and detecting an indication that a predetermined amount of time has elapsed during analysis of the sequential circuitry netlist.

16. The product of claim 10, wherein the configuring of the sequential circuitry netlist to connect the arbitrary gate to a multiplexer further comprises:
    connecting the arbitrary gate output to a first input of the multiplexer;
    connecting an inversion of the arbitrary gate output to a second input of the multiplexer; and
    connecting an output of the multiplexer at a point in the sequential circuitry where the arbitrary gate output was previously connected.

17. The product of claim 10, wherein the arbitrary gate is a first random gate, said method further comprising:
    selecting a second arbitrary gate of the sequential circuitry for analysis.

18. The product of claim 10, wherein said time that the multiplexer output is set to alter the arbitrary gate output is a single clock period.

* * * * *